US005502299A

United States Patent [19]
Standley

[11] Patent Number: 5,502,299
[45] Date of Patent: Mar. 26, 1996

[54] CURRENT RATIO CIRCUIT FOR MULTI-COLOR IMAGING

[75] Inventor: David L. Standley, Westlake Village, Calif.

[73] Assignee: Rockwell International Corporation, Seal Beach, Calif.

[21] Appl. No.: 354,348

[22] Filed: Dec. 12, 1994

[51] Int. Cl.$^6$ .................................................. G01J 3/50
[52] U.S. Cl. ...................... 250/208.2; 250/226; 327/514
[58] Field of Search ........................... 250/208.1, 208.2, 250/208.5, 214 R, 214.1, 226; 348/272, 237, 294; 358/482; 327/342, 355, 514, 515; 257/440, 257, 258

[56] References Cited

U.S. PATENT DOCUMENTS

| | | | |
|---|---|---|---|
| 4,660,075 | 4/1987 | Hashimoto et al. | 358/29 |
| 4,677,289 | 6/1987 | Nozaki et al. | 250/208.2 |
| 5,381,054 | 1/1995 | Standley | 327/82 |

OTHER PUBLICATIONS

Perez et al., "Toward Color Image Segmentation in Analog VLSI: Algorithm and Hardware," *International Journal of Computer Vision*, 12:1, pp. 17–42 (1994).

*Primary Examiner*—Edward P. Westin
*Assistant Examiner*—John R. Lee
*Attorney, Agent, or Firm*—John C. McFarren

[57] ABSTRACT

An electronic circuit extracts a ratio of currents from two sources and provides an output that is a function of the current ratio. An embodiment of the circuit includes a source current that may be provided by a blue-green photodetector and a sinking current that may be provided by a red photodetector. The source current feeds the input of a current splitter formed by a pair of PFETs. A portion of the source current is fed from the current splitter to a current ratio extractor implemented in CMOS. The remaining portion of the current from the current splitter is fed to a node shared with the sinking current and a second input to the current ratio extractor. The current ratio extractor produces an output voltage that is a function of the ratio of the photodiode currents and is substantially independent of the total current. The output voltage provides color information that may be used in low-cost machine vision systems for tasks such as sorting objects based on color or detecting object boundaries while rejecting shadows and reflective glints.

17 Claims, 2 Drawing Sheets

5,502,299

CURRENT RATIO CIRCUIT FOR MULTI-COLOR IMAGING

TECHNICAL FIELD

The present invention relates to machine vision systems and, in particular, to a photodetector imaging system having an electronic current ratio circuit for extracting color information.

BACKGROUND OF THE INVENTION

Special purpose analog processors are known in the art of machine vision for performing computationally intensive tasks such as edge detection and noise point removal. In a machine vision system with an array of photodetectors, an image can be focused directly onto the surface of the die. Other systems allow external data to be scanned in, as from an infrared focal-plane array, for example. Integrated sensor systems may include an array of photosensors and a low-power analog processor on a single chip. Such systems can be implemented on a VLSI chip using a standard CMOS process for low cost fabrication. Generally, these are compact, low cost, low power systems that accept raw image data and provide a digital output (such as an edge map), a processed gray-level image, or both.

Most conventional machine vision systems use gray-level imaging. However, the ability to process color information in machine vision systems and related applications is becoming increasingly important because there are tasks for which gray-level imaging alone is inadequate. Examples of such tasks include sorting objects based on color and detecting object boundaries while rejecting shadows and reflective glints.

A sought after "smart" machine vision system should be able to extract color information that is independent of individual pixel or scene brightness. Photodiodes having various response versus wavelength curves are available in standard CMOS and BiCMOS processes. Photodiodes with responses peaking at three different wavelengths are available with the BiCMOS process. These responses correspond to the junctions of a bipolar transistor, which are at various depths under the surface of a substrate. With a standard CMOS process, the well-substrate and heavily doped diffusions make at least two "colors" available. Color information can be extracted by taking the ratios of these photocurrents, to give information such as saturation and hue. Translinear circuits using MOS transistors operating in subthreshold have been built to compute these ratios.

Large random mismatch in current mirrors and related circuitry, especially with compact device dimensions, is a disadvantage of translinear circuits using MOS transistors operating in subthreshold. Photocurrent ratios from the various diodes are very modest, even for artificially constructed scenes with bright colors. Natural scenes tend to provide weak ratio signals among the large gray-level contrasts typically encountered. The achievable dynamic range (i.e., for color resolution) is very limited, especially with a circuit topology in which each raw photocurrent signal initially passes through a separate set of computational devices in a translinear network, as in the prior art. This is also true if current mirrors are used to perform weighted sums or differences of signals before generating ratios. This problem might be mitigated, at least in principle, using normalization or offset correction. Offset correction might be accomplished, for example, by using the difference signals of photocurrents to find a center point corresponding to a white pixel. This method, however, would require some means of programming or chopping with a reference scene. At the device level, colored films could be used to cover the photodiodes as is done with imaging arrays (as in regular video cameras, for example) to allow better discrimination. The effectiveness of this method would depend on the films and particular response curves available.

Because of the low photocurrent ratios from standard CMOS and BiCMOS photodiodes having different spectral responses and the fixed pattern noise introduced by device mismatches, there is a need for improved techniques of extracting color information in real time from a low cost photosensor imaging system.

SUMMARY OF THE INVENTION

The present invention comprises an electronic circuit that extracts a ratio of currents from multiple sources and provides an output that is a function of the current ratio. One embodiment of the current ratio circuit includes two current inputs—a source current that may be provided by a first photodetector and a sinking current that may be provided by a second photodetector. The source current feeds the input of a current splitter. A portion of the source current is fed from the current splitter to a current ratio extractor. The remaining portion of the current from a the current splitter is fed to a node shared with the sinking current and a second input to the current ratio extractor. The current ratio extractor comprises a circuit that provides an output signal containing information about the ratio of its input currents from the photodetectors and current splitter.

In an exemplary CMOS embodiment, a blue-green photodiode functions as the source from a positive supply rail and a red photodiode functions as the sink to ground. A pair of PFET devices function as the current splitter. The current ratio extractor comprises several FETs and a voltage-controlled current source (VCCS). The current ratio extractor produces an output voltage that is a function of the ratio of the photodiode currents and is substantially independent of the total current. The output voltage provides color information that may be used in machine vision systems for tasks such as sorting objects based on color or detecting object boundaries while rejecting shadows and reflective glints. Multi-color information can be obtained by combining two or more photocurrent ratio circuits.

A principal object of the invention is to extract color information from photodetectors in an imaging system. A feature of the invention is a photocurrent ratio circuit. An advantage of the invention is real time color information in a low-cost machine vision system.

BRIEF DESCRIPTION OF THE DRAWINGS

For a more complete understanding of the present invention and for further advantages thereof, the following Detailed Description of the Preferred Embodiments makes reference to the accompanying Drawings, wherein the same reference numerals refer to the same or similar elements through the Figures, in which.

DETAILED DESCRIPTION OF THE PREFERRED EMBODIMENTS

Figure 1:
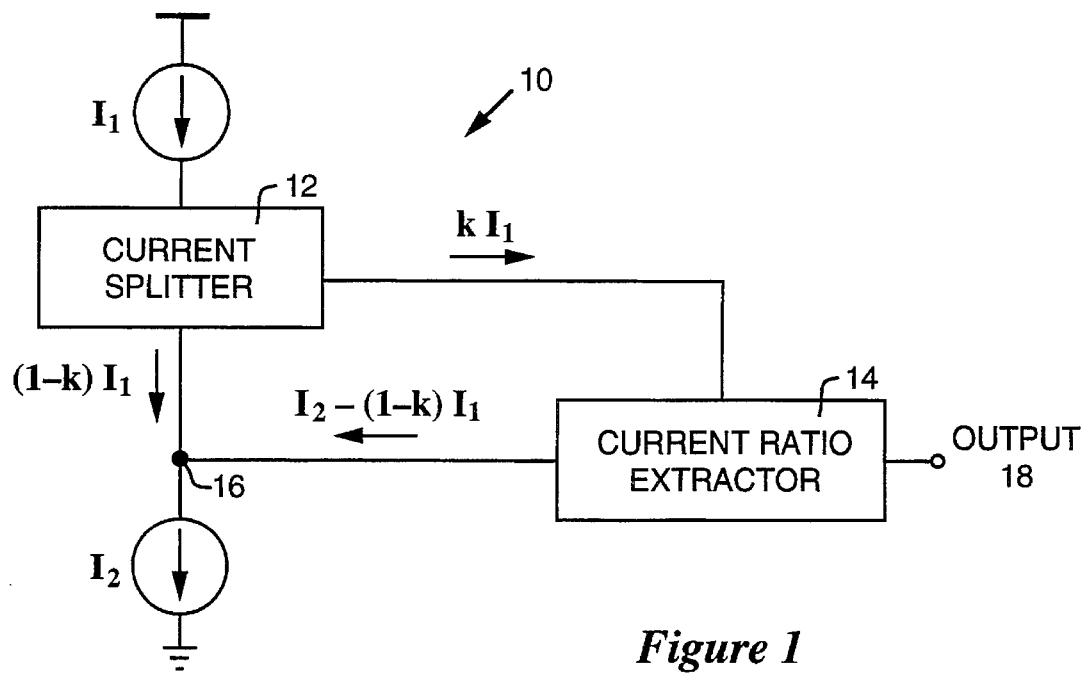
FIG. 1 is a schematic block diagram of a basic current ratio circuit of the present invention.

The present invention comprises an electronic circuit that extracts a ratio of currents from multiple sources and provides an output that is a function of the current ratio. A basic current ratio circuit 10 of the present invention is shown in the schematic block diagram of FIG. 1. Circuit 10 includes two current inputs—a source current $I_1$ and a sinking current $I_2$. Source current $I_1$ feeds the input of a current splitter 12, which may include a means for adjusting the split ratio. A portion k of current $I_1$ input to splitter 12 (i.e., k $I_1$) is fed from current splitter 12 as a first input to a current ratio extractor 14. The remaining portion of the current from current splitter 12, (1–k) $I_1$, is fed to a node 16 shared with sinking current $I_2$ and a second input to current ratio extractor 14. The second input to current ratio extractor 14 thus comprises current $I_2-(1-k)I_1$. Current ratio extractor 14 may comprise any circuit that provides an output signal 18 containing information about the ratio of its input currents k $I_1$ and $I_2-(1-k)I_1$, whether or not output 18 is solely dependent on this ratio.

There are two important properties of the extracted or processed ratio $[I_2-(1-k)I_1]/k\ I_1$ output by current ratio extractor 14. First, the extracted ratio is sensitive to the "raw" ratio $I_2/I_1$, especially for small values of k. Thus, there is a reduction in the effect of device mismatches in a translinear implementation of extractor 14. Second, the extracted ratio sensitivity to k is very small if $I_2/I_1$ is close to unity. If the raw ratio $I_2/I_1$ is known to be limited to a certain range near unity, the sensitivity to k will be similarly limited. In fact, when $I_2/I_1$ is unity, the k dependence drops out completely. Therefore, current splitter 12 may comprise a differential pair of transistors, with the effect of its associated deviation about a nominal k value limited by the maximum deviation of $I_2/I_1$ from unity. An advantage of the present invention is that imaging arrays can extract this current ratio with high pixel uniformity in a continuous, real-time analog mode, with no need of correction for random transistor mismatches.

Figure 2:
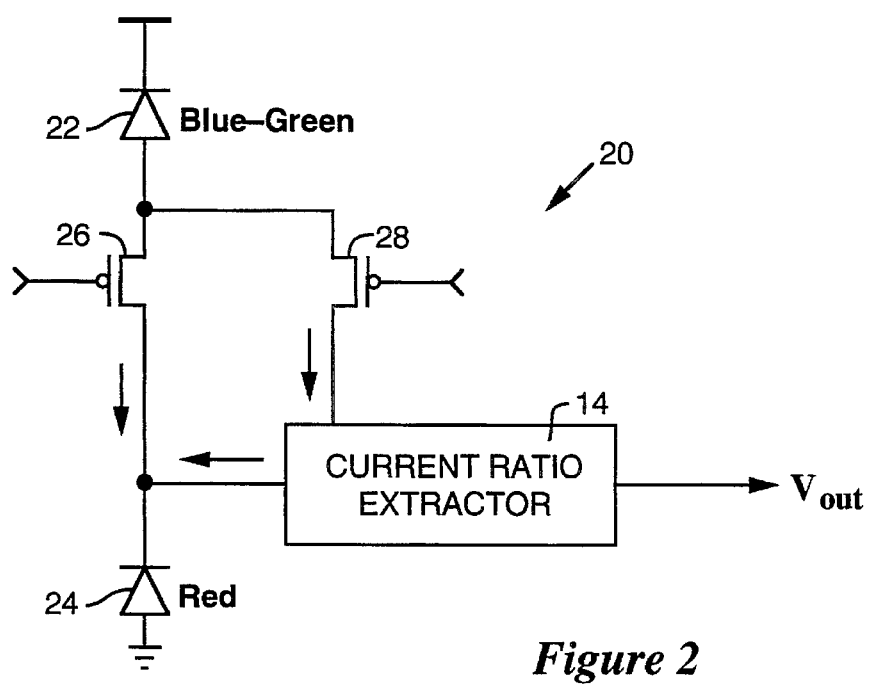
FIG. 2 is a schematic block diagram of a photocurrent ratio circuit of the present invention for extracting color information from a pair of photodetectors.

FIG. 2 illustrates an example of the present invention that adapts the circuit of FIG. 1 to a two-color imager implemented in CMOS. In extraction circuit 20, photodiode 22 provides source current $I_1$ and photodiode 24 provides sinking current $I_2$. Photodiode 22 may comprise a heavily-doped p-diffusion in an n-well, for example, which responds primarily to light in the blue-green spectral region. Photodiode 24 may comprise an n-well in the p-substrate, for example, which responds primarily to light in the red spectral region. Alternatively, photodiode 24 may have a heavily doped p-diffusion layer shorted to the well, for improved selectivity. Furthermore, the photodiodes 22 and 24 may be interdigitated, to limit spatial aliasing effects.

In circuit 20, blue-green photodiode 22 functions as the source from the positive supply rail and red photodiode 24 functions as the sink to ground. A pair of PFET devices 26 and 28 function as the current splitter. The biases applied to the gates of PFETs 26 and 28 determine the value of k and establish a reverse bias on blue-green photodiode 22. In an alternative embodiment, a pair of NFETs may be common source connected to red photodiode 24. Appropriate sizing of photodiodes 22 and 24 assures operation near the optimum zero-sensitivity point of the current splitter. In circuit 20, current ratio extractor 14 produces an output voltage $V_{out}$ that is a function of the ratio of the photodiode currents and substantially independent of the total current.

Figure 3:
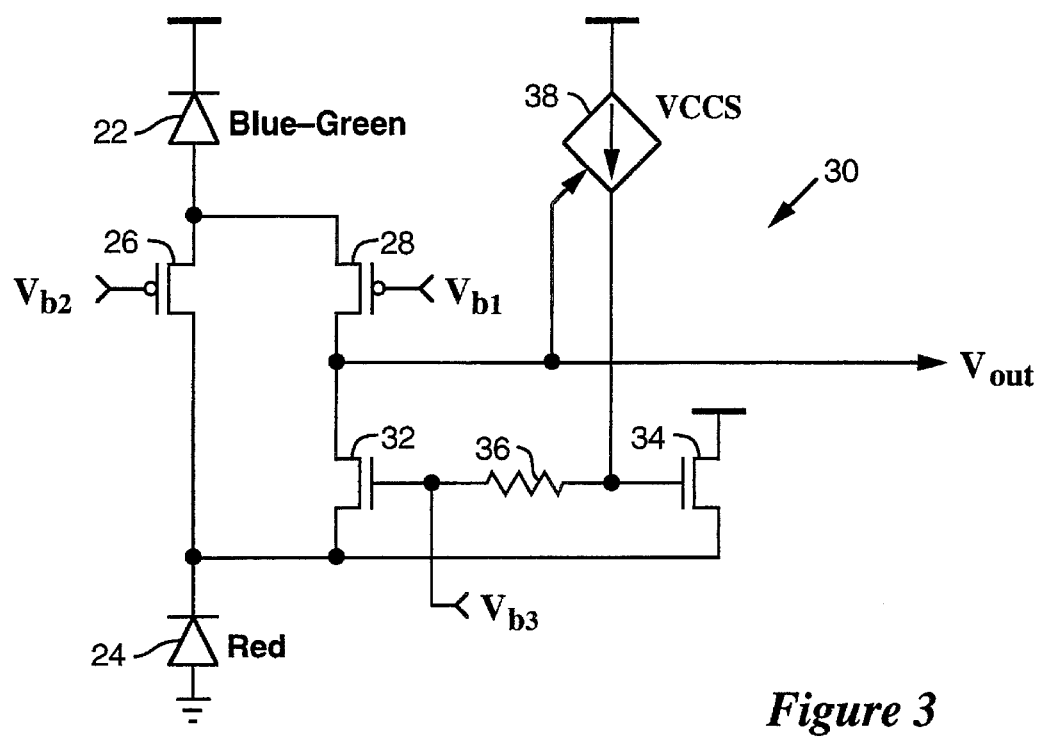
FIG. 3 is a schematic diagram of a CMOS implementation of the photocurrent ratio circuit of FIG. 2.

FIG. 3 is a schematic diagram illustrating a CMOS implementation of a color ratio circuit 30 for photodiodes 22 and 24. PFETs 26 and 28, having bias voltages $V_{b2}$ and $V_{b1}$, respectively, form the current splitter as described above. The current ratio extractor, which provides an unbuffered output voltage $V_{out}$, is formed by NFETs 32 and 34, a resistance means 36, and a voltage-controlled current source (VCCS) 38. The total current through the common sources of NFETs 32 and 34 is split between the drain of PFET 28 and the upper supply rail, the weighting being determined by resistance 36 and the current through VCCS 38. If NFETs 32 and 34 are operated in subthreshold, as would be the case with typical photodiode currents, the weighting is substantially independent of the current itself. VCCS 38 has a negative transconductance with respect to $V_{out}$. Thus, $V_{out}$ will settle to the value for which the drain currents of NFET 32 and PFET 28 are equal, if the external load current (DC) is zero. The photodiode current ratio is then indicated by $V_{out}$. Bias voltage $V_{b3}$ (which sinks the current from VCCS 38) should be maintained within a range that: (a) establishes a reverse bias across photodiode 24 (in view of the gate-to-source drop across NFET 32), and (b) allows NFET 32 to operate in saturation for the desired range of $V_{out}$ values. Note that this embodiment is single-ended in that the photocurrent ratio, as defined above, must be greater than unity to prevent $V_{out}$ from being clipped by PFET 28 leaving saturation. This a simple circuit, however, which can produce a strong voltage-mode signal suitable for subsequent scan-out or processing in an array, and the advantages of the present invention can be realized with an appropriate choice of parameters, such a sufficiently small value for k. If circuit speed is a factor because of low operating brightness and circuit capacitances, the settling time can be shortened by connecting the input of a voltage amplifier to the drains of NFET 32 and PFET 28, and its output to the VCCS control input (which is also $V_{out}$).

Figure 4:
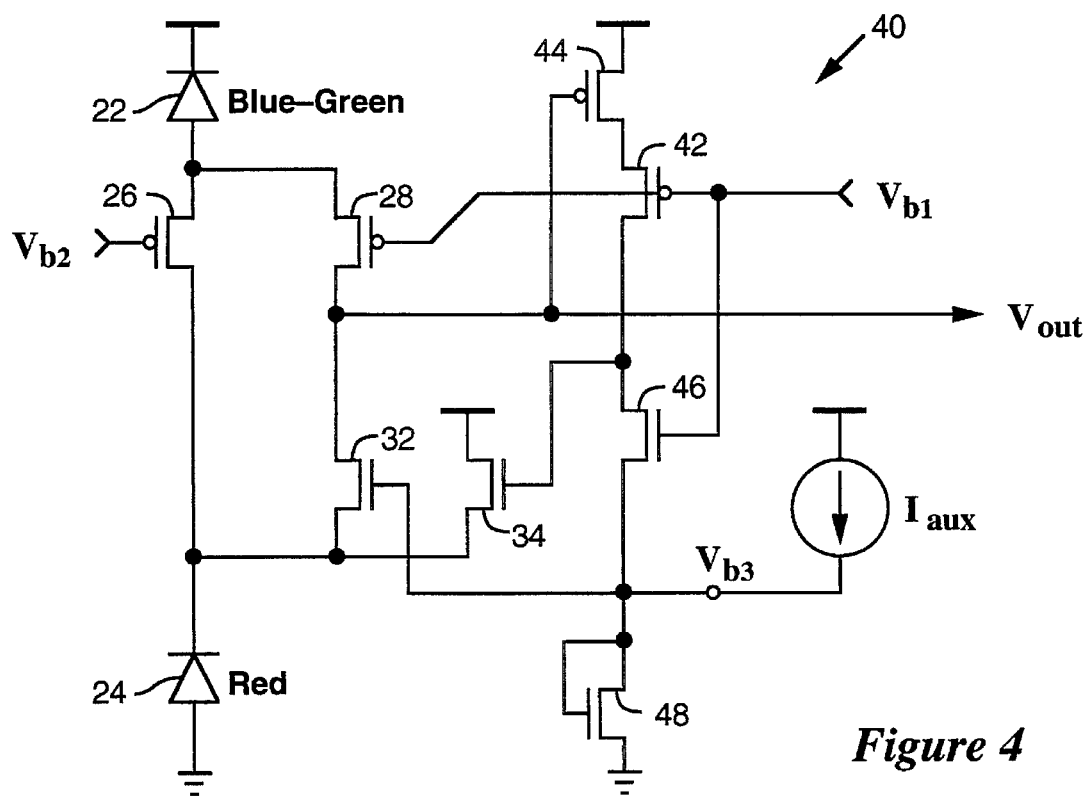
FIG. 4 is a schematic diagram of a transistor-level implementation of the photocurrent ratio circuit of FIG. 3.

FIG. 4 shows a complete transistor-level circuit diagram of color ratio circuit 30. The VCCS is a programmable current source comprising PFETs 42 and 44. The bias voltage $V_{b1}$ is shared with the gate of PFET 28 and the VCCS. $V_{b1}$ can be set so that PFET 42 operates a small amount above threshold if the gate of PFET 44 is grounded. NFET 46 operates in the ohmic region to form resistance 36. Although the gate of NFET 46 can be tied to the upper supply rail, in the preferred embodiment it is tied to $V_{b1}$ to provide a lower bias above threshold, and thus higher resistance and lower operating current and power dissipation for a given device dimension. The current from the VCCS passes through a diode-connected NFET 48, which produces the bias voltage $V_{b3}$. In situations where PFET 44 can be cut off by a high output voltage $V_{out}$, a current source $I_{aux}$ can used to keep $V_{b3}$ high enough for proper operation of the NFET splitter pair 32 and 34, as described above. In an array of elements, $V_{b3}$ can be a global bus (which also indicates a color average over the array), and $I_{aux}$ can be provided at a point on the edge of the array, to minimize the circuit area. The response curve of $V_{out}$ versus the photocurrent ratio depends on the parameters of the circuit elements. The VCCS current, as a function of the photocurrent ratio, gets compressed as the ratio moves away from unity, because NFETs 32, 34, and 46 implement a pseudo-log type compression. However, the incremental transconductance of the VCCS also rolls off at higher currents. These nonlinearities tend to cancel, resulting in a smooth, modest response curve with selection of appropriate parameters and biasing, as dictated by the particular application.

Multi-color imaging information can be obtained by combining two or more of the color ratio circuits described above. If photodetectors with three different color sensitivities are available (e.g., red, green, and blue), four photodetectors can be used in two color ratio circuits, with each circuit having a common color photodetector. For example, a first color ratio circuit having photodiodes sensitive to red and green wavelengths might be combined with a second color ratio circuit having photodiodes sensitive to blue and green wavelengths. The resulting output would provide information of the relative red, green, and blue content of the received light. The common color detectors must source (or sink) current and the two remaining detectors must sink (or source) current. This scheme can be extended further to four or more colors by an expanded set of photodetectors and current ratio circuits. As mentioned above, films or filters can be used to implement the multi-color detectors.

Although the present invention has been described with respect to specific embodiments thereof, various changes and modifications can be carried out by those skilled in the art without departing from the scope of the invention. Therefore, it is intended that the present invention encompass such changes and modifications as fall within the scope of the appended claims.

I claim:

1. An electronic circuit, comprising:
   a first current source providing a source current;
   a second current source providing a sinking current;
   a current splitter connected to said first and second current sources; and
   means connected to said current splitter and said second current source for providing an output comprising a function of said source current and said sinking current.

2. The electronic circuit of claim 1, wherein said first current source comprises a first photodetector sensitive to a first spectral region and said second current source comprises a second photodetector sensitive to a second spectral region.

3. The electronic circuit of claim 1, wherein said current splitter comprises a first FET connected between said first and second current sources and a second FET connected between said first current source and said output means.

4. The electronic circuit of claim 3, wherein said output means comprises a third FET connected between said second Flit and said second current source, a fourth FET connected to said second current source, a resistance means connected between the gates of said third and fourth FETs, and a voltage-controlled current source connected to the gate of said fourth FET.

5. The electronic circuit of claim 1, wherein said current splitter splits said first current into a first split current and a second split current, and said output means provides an output comprising a ratio of said first split current and a function of said sinking current and said second split current.

6. The electronic circuit of claim 1, wherein said source current comprises $I_1$, said sinking current comprises $I_2$, said first split current comprises $k I_1$, said second split current comprises $(1-k)I_1$, and said output means provides an output related to the ratio $[I_2-(1-k)I_1]/k I_1$.

7. An electronic circuit, comprising:
   a first current source providing a source current;
   a second current source providing a sinking current;
   a current splitter connected between said first and second current sources, said current splitter splitting said source current into a first split current and a second split current;
   a current ratio extractor connected to said current splitter and said second current source; and
   said current ratio extractor providing an output related to a ratio of said first split current and a function of said sinking and second split currents.

8. The electronic circuit of claim 7, wherein said first current source comprises a first photodetector sensitive to a first spectral region and said second current source comprises a second photodetector sensitive to a second spectral region.

9. The electronic circuit of claim 7, wherein said current splitter comprises a first PFET connected between said first and second current sources and a second PFET connected between said first current source and said current ratio extractor.

10. The electronic circuit of claim 9, wherein said current ratio extractor comprises a first NFET connected between said second PFET and said second current source, a second NFET connected to said second current source, a resistance means connected between the gates of said first and second NFETs, and a voltage-controlled current source connected to the gate of said second NFET.

11. The electronic circuit of claim 7, wherein said source current comprises $I_1$, said sinking current comprises $I_2$, said first split current comprises $k I_1$, said second split current comprises $(1-k)I_1$, and said current ratio extractor provides an output related to the ratio $[I_2-(1-k)I_1]/k I_1$.

12. An electronic circuit for a machine vision system, comprising:
   a first photodetector sensitive to a first spectral region providing a source current;
   a second photodetector sensitive to a second spectral region providing a sinking current;
   a current splitter connected between said first and second photodetectors, said current splitter splitting said source current into a first split current and a second split current;
   a current ratio extractor connected to said current splitter and said second photodetector; and
   said current ratio extractor providing an output comprising a ratio of said first split current and a function of said sinking current and said second split current.

13. The electronic circuit of claim 12, wherein said source current comprises $I_1$, said sinking current comprises $I_2$, said first split current comprises $k I_1$, said second split current comprises $(1-k)I_1$, and said current ratio extractor provides an output related to the ratio $[I_2-(1-k)I_1]/k I_1$.

14. The electronic circuit of claim 13, wherein said first photodetector is sensitive to a blue-green spectral region and said second photodetector is sensitive to a red spectral region.

15. The electronic circuit of claim 13, wherein said current splitter comprises a first PFET connected between said first and second photodetectors and a second PFET connected between said first photodetector and said current ratio extractor.

16. The electronic circuit of claim 15, wherein said current ratio extractor comprises a first NFET connected between said second PFET and said second photodetector, a second NFET connected to said second photodetector, a resistance means connected between the gates of said first and second NFETs, and a voltage-controlled current source connected to the gate of said second NFET.

17. The electronic circuit of claim 16, wherein said voltage-controlled current source comprises a third PFET having a gate connected to said output and a fourth PFET connected to said third PFET and having a gate connected to the gate of said second PFET.

* * * * *